US007226858B2

(12) United States Patent
Williams et al.

(10) Patent No.: US 7,226,858 B2

(45) Date of Patent: Jun. 5, 2007

(54) SUBMICRON CONTACT FILL USING A CVD TIN BARRIER AND HIGH TEMPERATURE PVD ALUMINUM ALLOY DEPOSITION

(75) Inventors: Jacob Lee Williams, Gilbert, AZ (US); Harold E. Kline, Phoenix, AZ (US)

(73) Assignee: Microchip Technology Incorporated, Chandler, AZ (US)

(*) Notice: Subject to any disclaimer, the term of this patent is extended or adjusted under 35 U.S.C. 154(b) by 374 days.

(21) Appl. No.: 11/030,035

(22) Filed: Jan. 6, 2005

(65) Prior Publication Data

US 2006/0076680 A1 Apr. 13, 2006

Related U.S. Application Data

(60) Provisional application No. 60/614,669, filed on Sep. 30, 2004.

(51) Int. Cl.
*H01L 21/4763* (2006.01)
*H01L 23/52* (2006.01)

(52) U.S. Cl. ...................... 438/655; 438/656; 438/664; 438/683; 438/688; 257/763; 257/765; 257/E21.585

(58) Field of Classification Search ................ 438/664
See application file for complete search history.

(56) References Cited

U.S. PATENT DOCUMENTS

| | | | | |
|---|---|---|---|---|
| 5,049,975 | A * | 9/1991 | Ajika et al. | 257/764 |
| 5,371,042 | A | 12/1994 | Ong et al. | |
| 5,521,120 | A * | 5/1996 | Nulman et al. | 438/653 |
| 5,828,131 | A * | 10/1998 | Cabral et al. | 257/757 |
| 5,918,149 | A | 6/1999 | Besser et al. | 438/680 |
| 5,962,923 | A * | 10/1999 | Xu et al. | 257/774 |
| 6,045,666 | A * | 4/2000 | Satitpunwaycha et al. | 204/192.17 |
| 6,114,764 | A | 9/2000 | Hoshino et al. | 257/751 |
| 6,191,033 | B1 * | 2/2001 | Liao et al. | 438/653 |
| 6,313,042 | B1 * | 11/2001 | Cohen et al. | 438/734 |
| 6,511,910 | B2 * | 1/2003 | Asahina et al. | 438/643 |

* cited by examiner

*Primary Examiner*—Stephen W. Smoot
(74) *Attorney, Agent, or Firm*—Baker Botts L.L.P.

(57) ABSTRACT

A submicron contact opening fill using a chemical vapor deposition (CVD) TiN liner/barrier and a high temperature, e.g., greater than about 385° C., physical vapor deposition (PVD) aluminum alloy layer that substantially fills the submicron contact.

24 Claims, 4 Drawing Sheets

SUBMICRON CONTACT FILL USING A CVD TIN BARRIER AND HIGH TEMPERATURE PVD ALUMINUM ALLOY DEPOSITION

RELATED PATENT APPLICATION

This application claims priority to commonly owned U.S. Provisional Patent Application Ser. No. 60/614,669; filed Sep. 30, 2004; entitled "Submicron Contact Fill Using a CVD TiN Barrier and High Temperature PVD Aluminum Alloy Deposition," by Jacob Lee Williams and Harold E. Kline; which is hereby incorporated by reference herein for all purposes.

TECHNICAL FIELD OF THE INVENTION

This invention relates generally to semiconductor integrated circuit manufacturing processes, and more particularly to submicron conductive contact filling of holes formed in insulating layers for connection to circuit elements of the semiconductor integrated circuit.

BACKGROUND OF THE RELATED TECHNOLOGY

A contact in a semiconductor integrated circuit allows electrical connection between metal conductors and circuit elements, e.g., transistors, in the semiconductor integrated circuit substrate. Generally, an oxide layer is deposited or otherwise formed on the substrate. A hole is formed in the oxide layer, and then filled with a conductive material, e.g., a via, to provide the electrical connection between the circuit elements and the metal conductors.

One technique currently used to form contacts involves using physical vapor deposition (PVD) to deposit a refractory metal, such as $MoSi_x$ or TiN as a barrier to prevent electro-migration, followed by a 200° C. to 450° C. PVD AlSiCu deposition. This technique, however, does not produce consistently filled contacts, or provide required electro-migration resistance at the newer submicron contact size and circuit element current densities.

SUMMARY OF THE INVENTION

Therefore, there is a need for a process to create submicron size contacts in a semiconductor integrated circuit that yields robust, repeatable contact fill with good step coverage and barrier properties that provide good electro-migration resistance (e.g., improved reliability) and improved yields at less cost than presently used contact fill technologies, such as a Ti/chemical vapor deposition (CVD) TiN contact liner followed by a tungsten CVD.

The present invention overcomes the above-identified problems as well as other shortcomings and deficiencies of existing technologies by providing a submicron semiconductor integrated circuit contact using a chemical vapor deposition (CVD) titanium nitride (TiN) barrier layer followed by a high temperature physical vapor deposition (PVD) aluminum alloy for creating the filled contact. In accordance with teachings of the present disclosure, a method is described herein for performing a submicron contact fill using a chemical vapor deposition (CVD) TiN liner/barrier and a high temperature, e.g., greater than about 385° C., PVD aluminum alloy, e.g., AlSiCu deposition.

Other embodiments include a semiconductor contact formed according to a method disclosed herein, and a semiconductor device including such a contact.

Forming a contact according to at least one embodiment can provide increased electro-migration resistance, and more consistent and reliable contact fills. More consistent contact fills can, in turn, result in improved electrical characteristics of the contact.

Various embodiments of the present disclosure provide cost savings and improved cycle time over other more conventional contact formation processes.

Other technical features and advantages will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings wherein.

Figure 1:
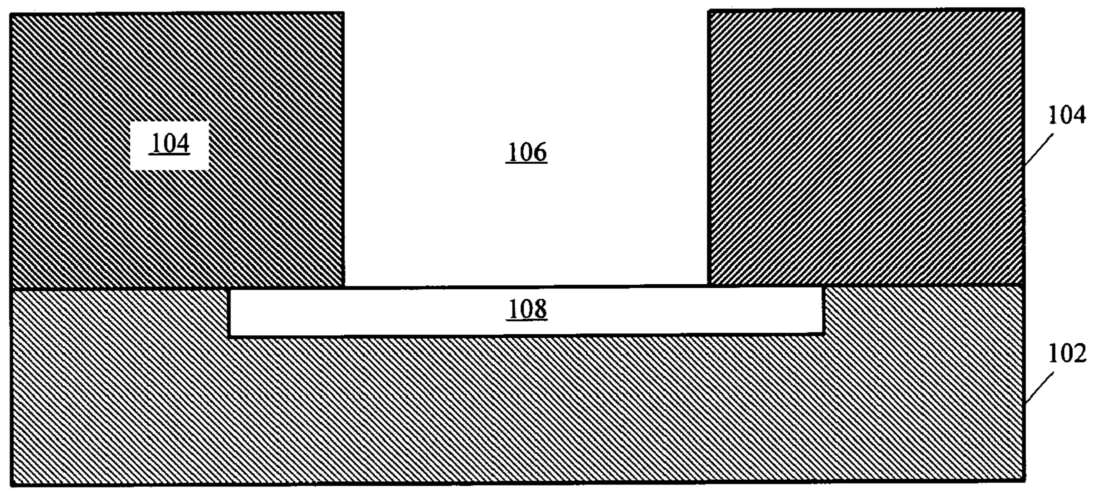
FIGS. 1–6 are schematic elevational sections of a portion of a semiconductor integrated circuit illustrating a process of forming a filled contact at various stages of the process, according to a specific embodiment of the present disclosure.

While the present disclosure is susceptible to various modifications and alternative forms, specific embodiments thereof have been shown by way of example in the drawing and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of specific embodiments of the present invention are schematically illustrated. Like elements in the drawings will be represented by like numbers, and similar elements will be represented by like numbers with a different lower case letter suffix.

Referring now to FIGS. 1–6, depicted are schematic elevational sections of a portion of a semiconductor integrated circuit illustrating a process of forming a filled contact at various stages of the process, according to a specific embodiment of the present disclosure. FIG. 1 depicts a portion of a semiconductor integrated circuit comprising a plurality of circuit elements, e.g., transistors, formed in a substrate, e.g., silicon, and the circuit elements may be interconnected with circuit conductors (not shown). An insulating film, e.g., an oxide layer 104, is deposited or otherwise formed on the substrate 102. The substrate 102 has circuit elements formed therein (only one element portion 108 shown for clarity). An opening 106 is formed through a hole in the oxide layer 104. The opening 106 may be part of a pattern defined by any of various photolithography processes. Oxide 104 is removed from the opening 106 using a suitable etching process known to those skilled in the art of manufacturing semiconductor integrated circuits, thereby exposing a contact area of the underlying substrate circuit element 108. In at least one embodiment, a pre-metal clean, e.g., chemical solution, may be performed to remove any native silicon dioxide growth (not shown) at the bottom of the contact opening 106.

Figure 2:
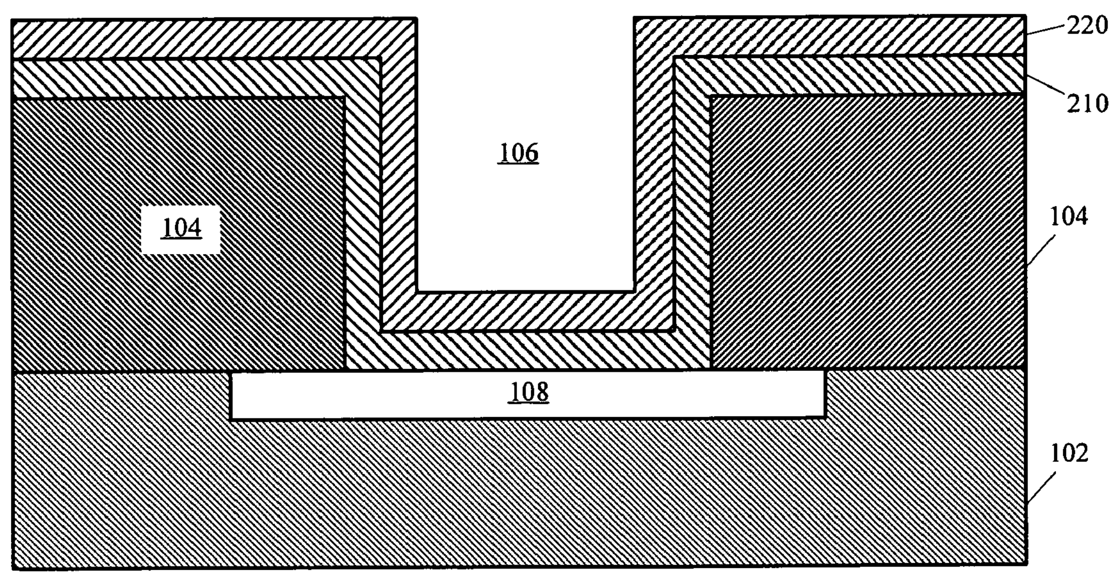

Referring now to FIG. 2, a layer 210 of ionized metal plasma (IMP) physical vapor deposition (PVD) titanium (Ti) between about 50 and 150 Angstroms thick is deposited in the opening 106 (over the oxide layer 104 and the contact area of the element portion 108). In at least one embodiment, layer 210 is nominally about 100 Angstroms thick. Next, a layer 220 of titanium nitride (TiN) between about 50–150 Angstroms is deposited over layer 210 using a chemical vapor deposition (CVD) process. In at least one embodiment, layer 220 is about 100 Angstroms thick. This combination may provide superior bottom coverage by the Ti layer 210 than other known processes, in addition to providing improved conformal TiN layer 220 coverage.

Figure 3:
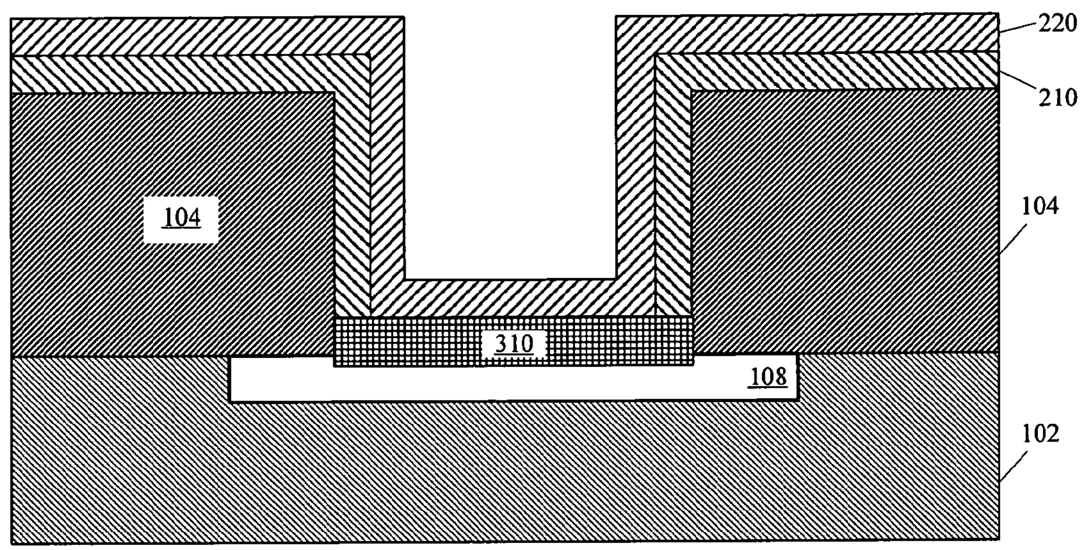

Referring next to FIG. 3, during the performance of rapid thermal processing (RTP) at about 750° C., a portion of the Ti layer 210 in contact with the silicon substrate element 108 reacts with the substrate material to form an area 310 of titanium silicide ($TiSi_2$) (C 54) at the bottom of the contact opening 106.

Figure 4:
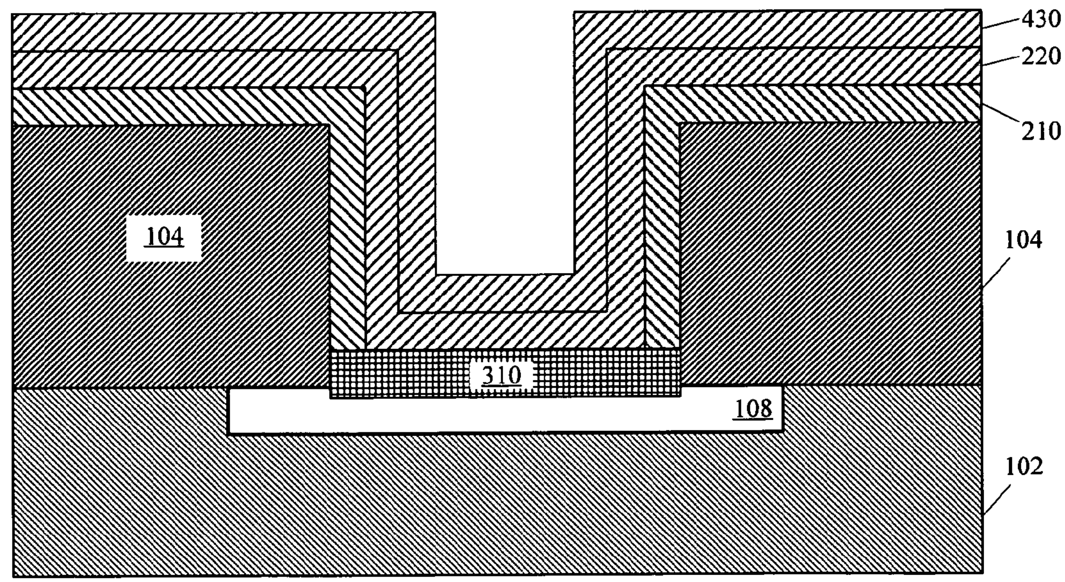
Figure 5:
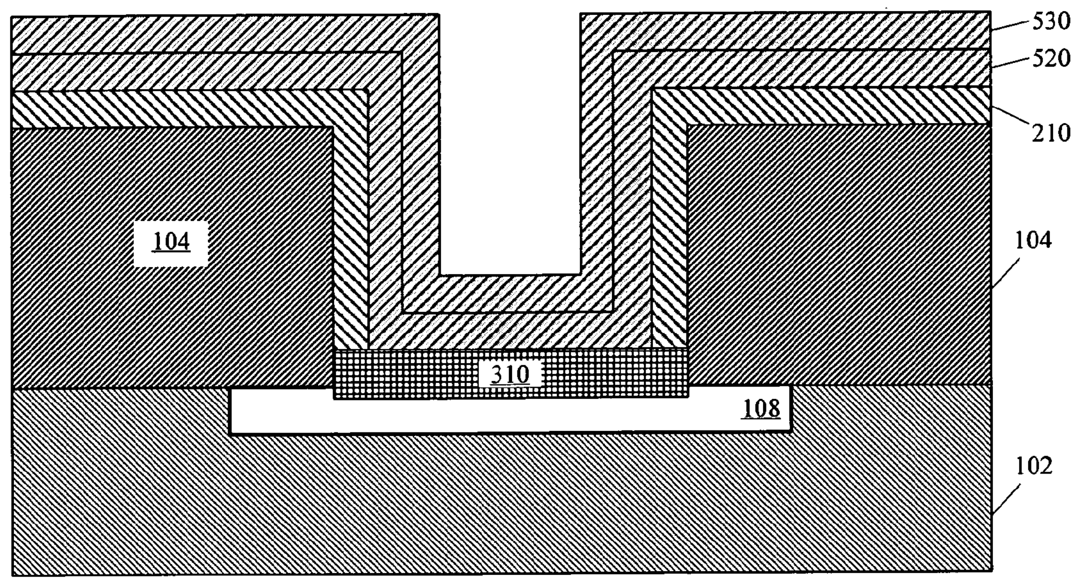

Referring now to FIGS. 4 and 5, a second layer 430 of CVD TiN between about 50–150 Angstroms, and preferably about 100 Angstroms, is deposited over layer 220. In at least one embodiment, open grain boundaries in the TiN layers 220 and 430 are stuffed with nitrogen in about a 500° C. environment, with ammonia ($NH_3$) and nitrogen ($N_2$) present, to generate stuffed TiN layers 520 and 530, which may have improved barrier properties over the unstuffed TiN layers 220 and 430.

Figure 6:
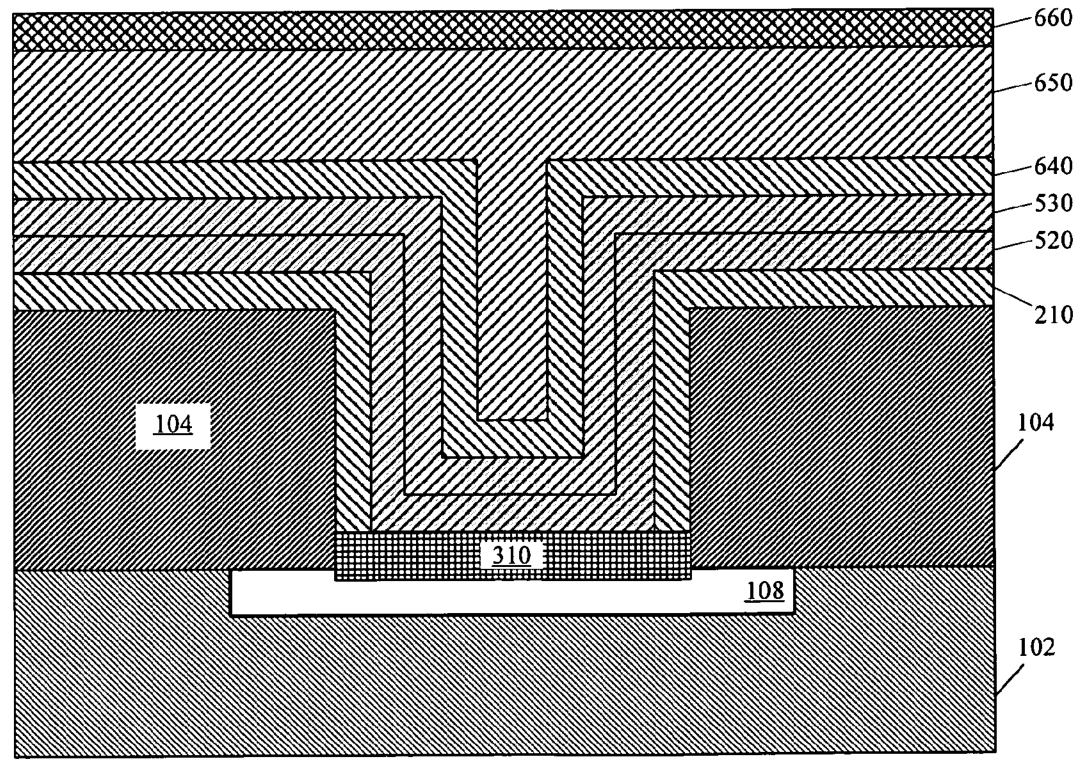

Referring now to FIG. 6, a Metal 1 deposition may be performed, during which the stuffed, TiN-lined (layers 520 and 530) opening is filled to complete the contact. A layer 640 of PVD Ti between about 400 and 1500 Angstroms, preferably about 700 Angstroms, thick is deposited over layer 530, followed by a fill layer 650 of PVD aluminum alloy between about 2,000 and 10,000 Angstroms, preferably 5,000 Angstroms, thick. In at least one embodiment, the Aluminum alloy may be an AlSiCu alloy including aluminum, about 1% silicon by weight, and about 0.5% copper by weight. The aluminum alloy is preferably deposited at greater than 385° C. In one embodiment, a temperature of approximately 400° C. may be used. Next a layer 660 of an anti-reflective metal, e.g., molybdenum silicide ($MoSi_x$), molybdenum silicide ($MoSi_{2.35}$) or TiN, is deposited over the layer 650. In at least one embodiment, $MoSi_x$ at about 500 Angstroms thick is preferred, and most preferably $MoSi_{2.35}$ at about 500 Angstroms in thickness.

The CVD TiN layers 520 and 530, below the PVD Ti layer 640 and the PVD aluminum alloy layer 650, provide an interface that is conducive to repeatable and reliable filling of submicron openings 106. According to the present invention, the PVD aluminum alloy layer 650 more easily "flows" into the opening 106 and stays there consistently when the underlying CVD TiN layer 520 and 530 are present. Without the CVD TiN layers 520 and 530, the PVD aluminum alloy layer 650 may be prone to pull out of the opening 106, thus leaving a void therein. In addition, this well-filled opening makes good electrical contact to the substrate element 108 and is capable of carrying a required current density without failure due to electro-migration.

Figure 7:
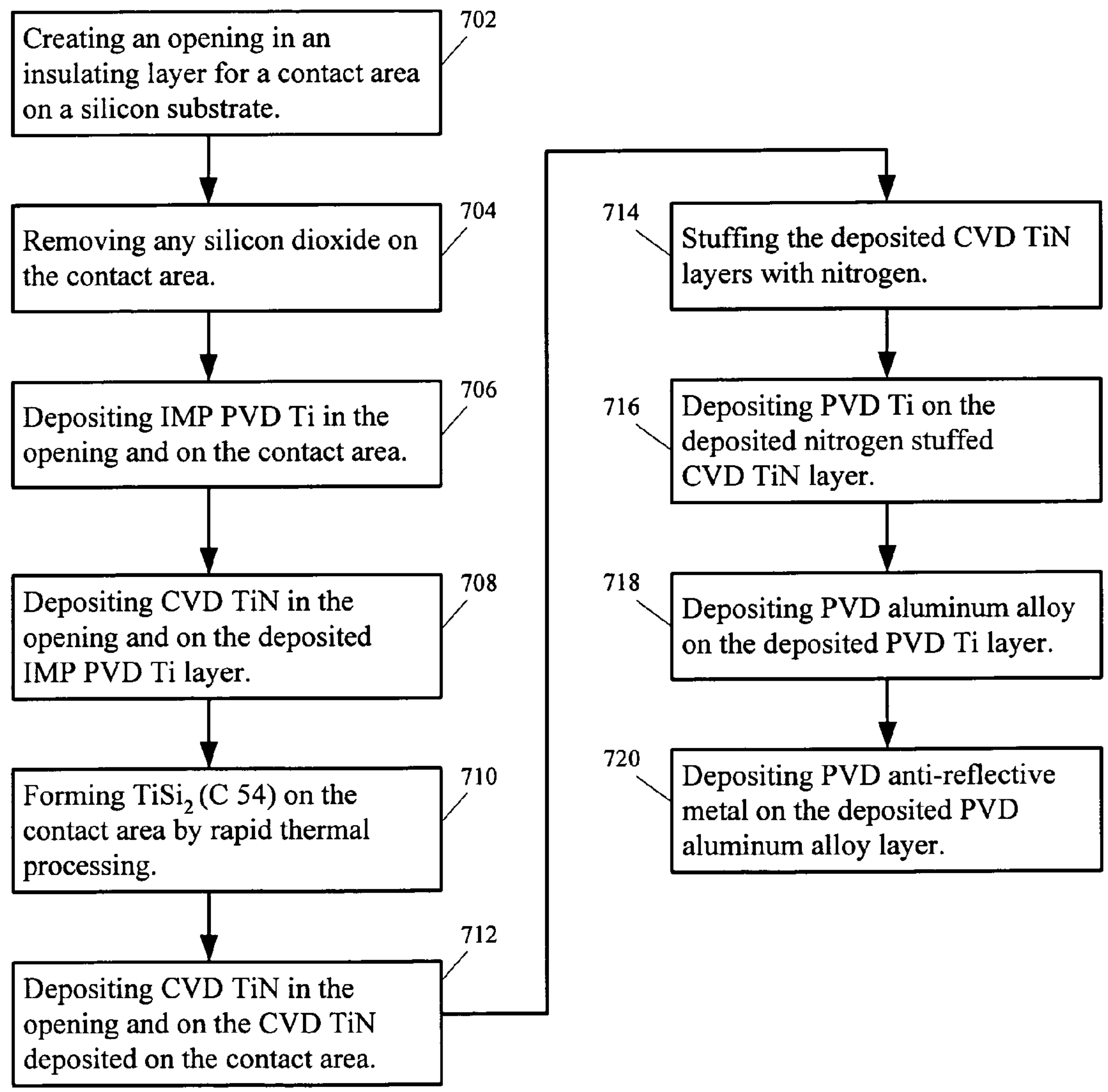
FIG. 7 is a flow diagram of a process for forming the filled contact, according to a specific embodiment of the present disclosure.

Referring to FIG. 7, depicted is a flow diagram of a process for forming a filled contact, according to a specific embodiment of the present disclosure. In step 702, an opening is created in an insulating layer for a contact area on a silicon substrate of a semiconductor integrated circuit. In step 704, any silicon dioxide is removed from the contact area. In step 706, a layer of Ti is deposited in the opening and on the contact area by IMP PVD. In step 708, a layer of TiN is deposited in the opening and on the previously deposited IMP PVD Ti layer by CVD. In step 710, $TiSi_2$ (C 54) is formed on the contact area by rapid thermal processing. In step 712, a layer of TiN is deposited in the opening and on the CVD TiN deposited in step 708 by CVD. In step 714, the deposited CVD TiN layers are stuffed with nitrogen. In step 716, a layer of Ti is deposited over the nitrogen stuffed CVD TiN layers by PVD. In step 718, an aluminum alloy is deposited over the PVD Ti layer of sufficient thickness to fill in the opening over the contact area by PVD. In step 720, an anti-reflective metal is deposited over the PVD aluminum alloy by PVD.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A method for forming a contact on a substrate of a semiconductor integrated circuit, said method comprising the steps of:

a) forming an opening in an insulating layer over a contact area on a semiconductor integrated circuit substrate;

b) cleaning the opening and the contact area;

c) depositing a layer of titanium (Ti) by ionized metal plasma (IMP) physical vapor deposition (PVD) in the opening and on the contact area;

d) depositing a layer of titanium nitride (TiN) by chemical vapor deposition (CVD) on the layer of Ti deposited in step c);

e) forming titanium silicide ($TiSi_2$) (C 54) at the contact area by rapid thermal processing;

f) depositing another layer of titanium nitride (TiN) by chemical vapor deposition (CVD) on the layer of titanium nitride (TiN) deposited in step d) and on the $TiSi_2$ (C 54) formed in step e);

g) depositing another layer of titanium (Ti) by physical vapor deposition (PVD) on the another layer of TiN deposited in step f);

h) depositing a layer of aluminum alloy by physical vapor deposition (PVD) on the layer of Ti deposited in step g), wherein the thickness of the layer of the deposited aluminum alloy is sufficient to substantially fill the opening; and i) depositing a layer of anti-reflective metal on the aluminum alloy deposited in step h).

2. The method according to claim 1, further comprising the step of stuffing the layers of TiN deposited in steps d) and f) with nitrogen.

3. The method according to claim 2, wherein the nitrogen is obtained from ammonia ($NH_3$) and nitrogen ($N_2$) gases.

4. The method according to claim 3, wherein the step of stuffing nitrogen is the step of stuffing nitrogen at a temperature of about 500 degrees Celsius.

5. The method according to claim 1, wherein the deposited layer of ionized metal plasma (IMP) titanium (Ti) of step c) is from about 50 to about 150 Angstroms in thickness.

6. The method according to claim 1, wherein the deposited layer of ionized metal plasma (IMP) titanium (Ti) of step c) is about 100 Angstroms in thickness.

7. The method according to claim 1, wherein the deposited layer of titanium nitride (TiN) of step d) is from about 50 to about 150 Angstroms in thickness.

8. The method according to claim 1, wherein the deposited layer of titanium nitride (TiN) of step d) is about 100 Angstroms in thickness.

9. The method according to claim 1, wherein the step of forming titanium silicide ($TiSi_2$) (C 54) at the contact area by rapid thermal processing is done at a temperature of about 750 degrees Celsius.

10. The method according to claim 1, wherein the deposited another layer of titanium nitride (TiN) of step f) is from about 50 to about 150 Angstroms in thickness.

11. The method according to claim 1, wherein the deposited another layer of titanium nitride (TiN) of step f) is about 100 Angstroms in thickness.

12. The method according to claim 1, wherein the deposited another layer of titanium (Ti) of step g) is from about 400 to about 1500 Angstroms in thickness.

13. The method according to claim 1, wherein the deposited another layer of titanium (Ti) of step g) is about 700 Angstroms in thickness.

14. The method according to claim 1, wherein the deposited layer of aluminum alloy of step h) is from about 2,000 to about 10,000 Angstroms in thickness.

15. The method according to claim 1, wherein the deposited layer of aluminum alloy of step h) is about 5,000 Angstroms in thickness.

16. The method according to claim 1, wherein the step of depositing the layer of aluminum alloy is done at a temperature higher than 385 degrees Celsius.

17. The method according to claim 1, wherein the layer of aluminum alloy comprises aluminum, silicon and copper.

18. The method according to claim 1, wherein the layer of aluminum alloy comprises aluminum, about one percent silicon and about 0.5 percent copper.

19. The method according to claim 1, wherein the anti-reflective metal of step i) comprises TiN.

20. The method according to claim 1, wherein the anti-reflective metal of step i) comprises molybdenum silicide ($MoSi_x$).

21. The method according to claim 1, wherein the anti-reflective metal of step i) comprises molybdenum silicide ($MoSi_{2.35}$).

22. A semiconductor apparatus comprising a contact formed by the method of claim 1.

23. A method for forming a contact on a substrate of a semiconductor integrated circuit, said method comprising the steps of:

a) forming an opening in an insulating layer over a contact area on a semiconductor integrated circuit substrate;

b) cleaning the opening and the contact area;

c) depositing a layer of titanium (Ti) by ionized metal plasma (IMP) physical vapor deposition (PVD) in the opening and on the contact area to a thickness of about 50 to about 150 Angstroms;

d) depositing a layer of titanium nitride (TiN) by chemical vapor deposition (CVD) on the layer of Ti deposited in step c) to a thickness of about 50 to about 150 Angstroms;

e) forming titanium silicide ($TiSi_2$) (C 54) at the contact area by rapid thermal processing at a temperature of about 750 degrees Celsius;

f) depositing another layer of titanium nitride (TiN) by chemical vapor deposition (CVD) on the layer of titanium nitride (TiN) deposited in step d) and on the $TiSi_2$ (C 54) formed in step e) to a thickness of about 50 to about 150 Angstroms;

g) stuffing the layers of TiN deposited in steps d) and f) with nitrogen at a temperature of about 500 degrees Celsius;

h) depositing another layer of titanium (Ti) by physical vapor deposition (PVD) on the another layer of TiN deposited in step f) to a thickness of about 400 to about 1500 Angstroms;

i) depositing a layer of aluminum alloy by physical vapor deposition (PVD) on the layer of Ti deposited in step h) to a thickness of about 2,000 to about 10,000 Angstroms at a temperature higher than 385 degrees Celsius, wherein the thickness of the layer of the deposited aluminum alloy is sufficient to substantially fill the opening; and j) depositing a layer of anti-reflective metal on the aluminum alloy deposited in step i).

24. A semiconductor apparatus comprising a contact formed by the method of claim 23.

* * * * *